United States Patent [19]

Ohta et al.

[11] 4,278,734

[45] Jul. 14, 1981

[54] OPTICAL INFORMATION RECORDING MATERIAL AND METHOD OF RECORDING AND REPRODUCING INFORMATION USING SAME MATERIAL

[75] Inventors: Takeo Ohta; Nobuo Akahira; Tatsushi Nakamura; Tadaoki Yamashita, all of Kadoma, Japan

[73] Assignee: Matsushita Electric Industrial Co., Ltd., Osaka, Japan

[21] Appl. No.: 64,748

[22] Filed: Aug. 8, 1979

[30] Foreign Application Priority Data

Aug. 17, 1978 [JP] Japan ............................. 53-100626

[51] Int. Cl.³ ........................................... C23C 3/04
[52] U.S. Cl. ................................. 428/432; 365/106; 365/127; 346/76 L
[58] Field of Search ............... 365/106, 120, 127, 113; 346/76 R, 76 L; 428/432; 350/160 P

[56] References Cited

U.S. PATENT DOCUMENTS

| 3,761,942 | 9/1973 | Lorenz et al. ............... 346/76 L |
| 3,971,874 | 7/1976 | Ohta et al. .................. 346/76 L |

*Primary Examiner*—Terrell W. Fears
*Attorney, Agent, or Firm*—Lowe, King, Price & Becker

[57] ABSTRACT

An optical information recording material comprising a thin film of a suboxide of a metal or semimetal of Group IIIB, IVB, VB or VIB, e.g. $TeO_x$ where $x<2.0$ or $BiO_x$ where $x<1.5$, added with up to 50 mole % of S and/or Se. When irradiated with light of relatively low energy density, the thin film exhibits such changes in optical density that information can be optically recorded on this material with high contrast ratio. Recorded information can be reproduced by either transmitted light or reflected light and, when desired, can be erased by light irradiation of adequate energy density.

13 Claims, 9 Drawing Figures

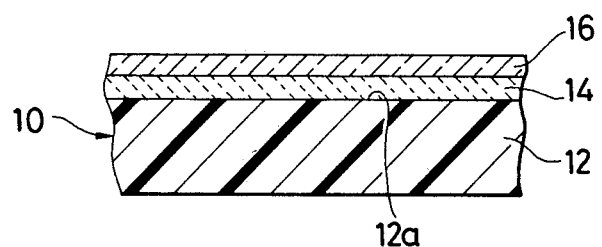
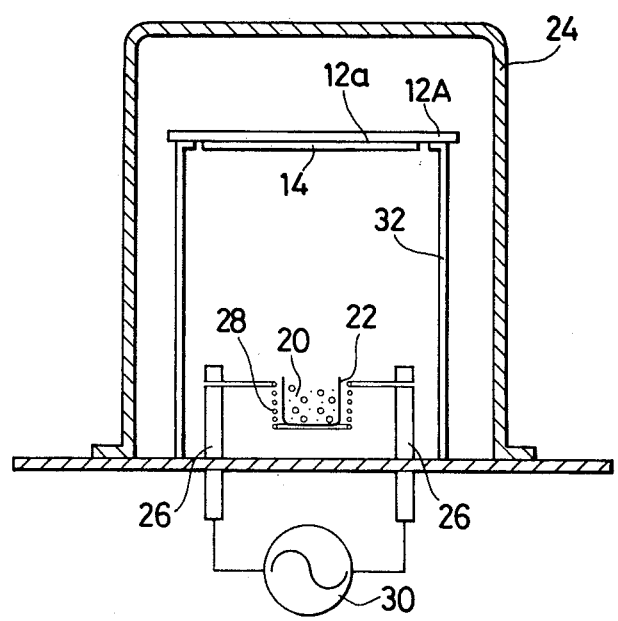

OPTICAL INFORMATION RECORDING MATERIAL AND METHOD OF RECORDING AND REPRODUCING INFORMATION USING SAME MATERIAL

BACKGROUND OF THE INVENTION

This invention relates to an optical information recording material of the type having a light-absorbing film which exhibits a change in optical density when light such as a laser beam is incident thereon and a method of optically recording and reproducing information by using the same recording material.

As the quantities of information to be recorded and reproduced are progressively increasing in recent years, there is a keen demand for an innovative method that enables more high-speed and more high-density recording of information and also more high-speed reproduction of the recorded information than the currently practiced information recording and reproducing methods. In this regard, much attention has recently been given to various methods of optically recording and reproducing information. Typical examples of hitherto proposed methods of this category are as follows.

As the first example, a recording method reported by D. Maydan, "The Bell System Technical Journal", Vol. 50, No. 6(1971), pp. 1761–88, is the use of a thin film (about 0.1 $\mu$m) of a low melting point metal such as indium or bismuth formed on a glass or plastic substrate. Using a laser beam, illumination of the metal thin film in very tiny spots (about 10 $\mu$m or smaller in diameter) causes formation of tiny cavities in the illuminated spots through absorption of light, rise in temperature and resultant fusion, displacement and/or evaporation of the metal. Thus the illuminated spots become transparent or translucent, so that an optically reproducible and permanent image is produced. A particular advantage of this method is the possibility of producing images of considerably high contrast ratio. However, limitations are placed on the construction of recording materials according to this method because of the occurrence of displacement of the material at the changes in optical density of the metallic recording film. Besides, it offers a problem in practical applications that the recording sensitivity of the metallic film is as low as $10^3$–$10^2$ mJ/cm$^2$.

As the second example, U.S. Pat. No. 3,636,526 proposes the use of an amorphous semiconductive material, more particularly a calcogenide not containing oxygen as typified by $Ge_{15}Te_{81}Sb_2S_2$, $As_2S_3$ and $As_{20}Se_{60}Ge_{20}$. When light such as a laser beam is applied to a thin film of such material, there occurs a change in the bonding state of the atoms of the material as a result of temperature increase by absorption of light, so that the thin film exhibits a change in optical density. As an advantage of this recording material, it is possible to erase the recorded information by applying light of adequate intensity. However, this recording material requires a recording light energy density of $2 \times 10^2$ mJ/cm$^2$ or above and suffers insufficient contrast ratio.

A still another method is the use of a thin film of a suboxide of a metal or semimetal. For example, U.S. Pat. No. 3,971,874 proposes a recording material having a thin film of which essential material is $TeO_x$ where x is smaller than 2.0 When irradiated with light such as a laser beam, the thin film of the suboxide undergoes a change from a low optical density state to a high optical density state as a result of temperature increase by absorption of light energy. This optical recording material is advantageous in that the recording sensitivity is very high ($10^2$ mJ/cm$^2$ or below) and that the magnitude of a maximum change in the optical density is very large (more than 30%) so that recording can be made with a very high contrast ratio (greater than 10:1). However, compared with the above described amorphous calcogenide this recording material is less easy of erasing information recorded thereon.

SUMMARY OF THE INVENTION

It is an object of the present invention to provide an optical information recording material which is high in optical recording sensitivity, undergoes great changes in optical density when irradiated with light and is easy of erasing information recorded thereon.

It is another object of the invention to provide a method of optically recording and reproducing information by using an optical recording material according to the invention.

It is a further object of the invention to provide an optical information-recording and reproducing method which uses a recording material according to the invention and makes it possible to erase the recorded information.

An optical information recording material according to the invention is characterized by comprising at least one suboxide of a metal or semimetal selected from the elements of Groups IIIB, IVB, VB and VIB, which suboxide is added with at least one of S and Se.

Usually this recording material comprises said at least one suboxide in the form of a thin film deposited on a base of a suitable material by, for example, vacuum evaporation technique.

Herein, "suboxide of a metal or semimetal" means an oxide containing a smaller amount of oxygen than the most stable oxide of the same metal or semimetal. For example, in the case of Te which is usually tetravalent a suboxide is expressed by "$TeO_x$ wherein $0<x<2.0$", and in the case of Bi which is usually trivalent a suboxide is expressed by "$BiO_x$ wherein $0<x<1.5$".

It is preferable to use at least one suboxide of Te, Ge, Sn and/or Si, or at least one suboxide of Bi, Sb, Tl and/or In. The addition of S and/or Se to the selected suboxide(s) is made such that the total amount of S and/or Se in the resultant composition does not exceed 50 mole%. Accordingly a suboxide of Te added with S in accordance with the invention is expressed by $(TeO_x)_{100-z}S_z$ wherein $0<x<2.0$, and $0<z\leq50$, and a suboxide of Bi added with Se is expressed by $(BiO_x)_{100-z}Se_z$ wherein $0<x<1.5$ and $0<z\leq50$.

When light is applied to the thin film of a recording material according to the invention at a relatively low energy density, the film exhibits an increase in optical density in the irradiated region. Accordingly information can easily be recorded on this recording material by application of light with the employment of a known technique of producing optical signals such as intensity modulation of a laser beam.

The information recorded on this recording material is reproduced by irradiating the thin film with a convenient light and detecting the intensities of either the light transmitted through the thin film or the light reflected on the thin film.

A suboxide with the addition of S and/or Se according to the invention undergoes a change from a high optical density state resulting from optical recording to a low optical density state before the recording when irradiated with light at an adequate energy density, so that information recorded on this recording material can be erased. To achieve satisfactory erasing of the recorded information, recording is made by using light pulses of a relatively long pulse duration and relatively low energy density, and then erasing is accomplished by using light pulses shorter in duration and higher in energy density than the recording pulses.

A recording material according to the invention is advantageous in the following points over the hitherto proposed and hereinbefore described optical recording materials.

This recording material can exhibit great magnitude of changes in the optical density nearly similarly to the recording material of U.S. Pat. No. 3,971,874, i.e. a thin film of a suboxide containing neither S nor Se, but nevertheless information recorded on this recording material can be erased easily. Besides, this recording material has a very high optical recording sensitivity. A satisfactory recording can be made at an energy density as low as about 50 mJ/cm$^2$, meaning that the recording sensitivity of this material is about four times as high as the sensitivity of the calcogenide used in U.S. Pat. No. 3,636,526.

BRIEF DESCRIPTION OF THE DRAWINGS

FIG. 1 is a sectional view of an optical information recording material according to the invention;

FIG. 2 is a schematic and vertical sectional view of a vacuum evaporation apparatus used in the production of an optical information recording material according to the invention;

DESCRIPTION OF THE PREFERRED EMBODIMENTS

Figure 3:
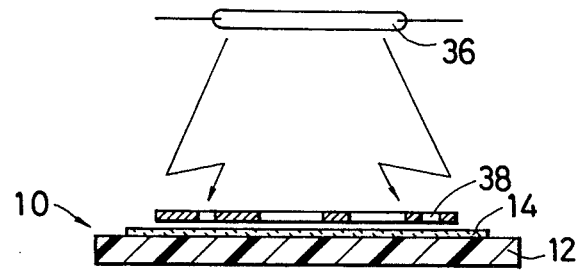
FIGS. 3-5 illustrate three embodiments of an optical information recording method according to the invention, respectively.

FIG. 1 shows a fundamental construction of an optical information recording material according to the invention. Essentially this material 10 is made up of a base 12 and a light-absorbing and photosensitive thin film 14 formed on a surface 12a of the base 12. Optionally, the film 14 may be overlaid with a light-transmissive protective layer 16. As stated hereinbefore, the photosensitive film 14 is of a suboxide of a metal or semimetal selected from the elements of Groups IIIB, IVB, VB and VIB, with the addition of sulfur and/or selenium. In principle only this film 14 is essential to a recording material according to the invention, but in practice the base 12 becomes necessary as a physical support for the film 14.

The material of the base 14 can be selected from a variety of metallic and nonmetallic materials. Some examples are metals such as aluminum, copper etc., paper, glasses such as soda glass, Pyrex and quartz glass, synthetic resins such as polystyrene, polyvinyl chloride, acrylic resin and ABS resin, and plastic films such as of polyvinyl acetate, polyester and polytetrafluoroethylene. From the viewpoint of facilitating optical reproduction of signal images produced in the photosensitive film 14, usually it is favorable that the base 12 is high in transparency as typified by a methacrylate resin sheet or a polyester film. The surface 12a of the base 12 is not necessarily flat but may be circular or otherwise curved.

Most conveniently, the thin film 14 of a suboxide of a metal or semimetal added with S and/or Se is produced by a vacuum evaporation method, using a mixture of a stable oxide of the metal or semimetal and S and/or Se. In the case of depositing $(TeO_x)_{100-z}M_z$ (where M represents S and/or Se) by way of example, a mixture of $TeO_2$ and M having a composition expressed by $(TeO_2)_{100-z}M_z$ (where $0 < z \leq 50$ in mole%) is used as the starting material. Prior to the vacuum evaporation operation, this mixture is subjected to a heat treatment which is continued for about 1-8 hr at about 120° C. when the additive M is S but at about 200° C. when M is Se.

Referring to FIG. 2, a starting material 20 such as a mixture of $TeO_2$ and S is put into a boat 22 or an alternative vessel, which is placed in a vacuum apparatus 24 having electrodes 26 connected to a power source 30 to heat the boat 22 either directly or via a heating coil 28. To accomplish vacuum evaporation of the starting material 20 under a deoxidizing condition, it is preferable that the boat 22 is of a metal having a reducing ability such as tungsten, titanium or molybdenum. Where the vessel 22 is of a practically inert material such as quartz, platinum or alumina ceramic, a small amount of a powdered reducing agent such as Fe, Al or Cr is added to the starting material 20 in the vessel 22. In the vacuum apparatus 24 a stand 32 supports a sheet material 12A selected as the base 12 of the optical information recording material 10 of FIG. 1 at a suitable distance above the boat 22. Vacuum evaporation of the starting mixture 20 is performed by maintaining a vacuum of the order of $10^{-5}$ to $10^{-6}$ mmHg in the vacuum apparatus 24 and heating the material 20 in the boat 22 at a temperature in the range of about 600°-1000° C.

Heating of the material 20 in the boat 22 under vacuum results in a reaction between the oxide such as $TeO_2$ and the additive M, at least partial fusion of the reaction system and evaporation and/or sublimation of the reaction system. The resultant vapor undergoes a certain extent of reduction during its passage from the boat 22 to the sheet material 12A, so that there occurs deposition of a suboxide containing the additive M, for example a composition expressed by $(TeO_x)_{100-z}M_z$ wherein x is smaller than 2.0, on the surface 12a of the sheet material 12A. The thickness of the resultant film 14 of such a composition can be controlled over a considerably wide range from about 0.07 μm to about 2 μm by varying certain factors such as the quantity of the starting material 20, effective surface area of the sheet material 12A etc.

Other than the illustrated heating method, it is possible to directly heat the starting material 20 by electron beam.

Recording of information on the above described optical recording material 10 can be made by using either visible rays or near infrared rays. Examples of useful light sources are flash lamps such as xenon flash lamp, He-Ne or other types of gas lasers and semiconductor lasers.

FIG. 3 shows an example of recording methods using flood light emitted by a xenon flash lamp 36. In this case, a mask 38 prepared by varying light transmittance of a light-transmissive film in selected areas so as to provide an optical pattern representing information to be recorded is placed on and kept in close contact with the light-absorbing film 14 of the recording material 10, and the xenon lamp 36 is located at a suitable distance above the mask 38. By flashing the xenon lamp 36, the thin film 14 is irradiated by light transmitted through the patterned mask 38 and undergoes local changes in its optical density to give light-and-shade images corresponding to the pattern of the mask 36.

Figure 4:
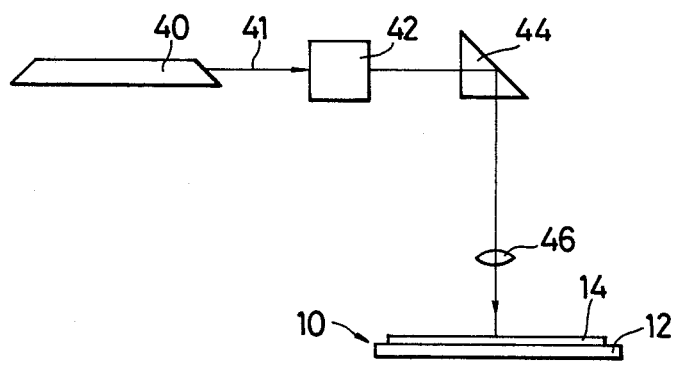

FIG. 4 illustrates a method of writing information on the recording material 10 by using a gas laser. In this case laser source 40 may be any of He-Ne laser (wavelength $\lambda = 632.8$ nm), He-Cd laser ($\lambda = 441.6$ nm) and Ar laser ($\lambda = 514.5$ nm). In a light modulator 42 such as a LiNbO$_3$ electrooptical light modulator or an ultrasonic light modulator, a laser beam 41 generated by the laser source 40 is subjected to intensity modulation according to an information signal supplied to this modulator 42. The modulated beam is reflected by a mirror 44 and then focused on the light-absorbing thin film 14 of the recording material 10 by a focusing lens 46. Thus a light spot or write pulse is applied to the film 14 with the result that a very small area of the film 14 undergoes an increase in optical density. (This phenomenon will be called "darkening" of the film 14.) This means writing of a bit signal on the recording material 10. A number of bit signals can be written on this recording material 10 by making a relative movement between the laser beam and the recording material 10, for example by using a beam positioner (not shown).

Figure 5:
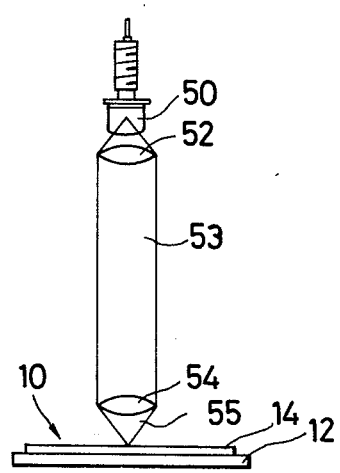

FIG. 5 shows the use of a semiconductor laser (e.g. $\lambda = 820$ nm). In general, a semiconductor laser generates laser rays diverging to the extent of about $\pm 20$ degrees. In this case, therefore, a conversion lens 52 is arranged near a semiconductor laser 50 such that the diverging laser rays are converted into pseud-parallel rays 53 by this lens 52. Then the pseud-parallel rays 53 are shaped into a spot light 55 by a focusing lens 54 such that the spot light 55 hits a selected region of the light-absorbing film 14 of the recording material 10. As the result, the film 14 darkens in the irradiated region. The intensity of the spot light 55 is variable according to an information signal to be recorded. Since it is easy to accomplish internal modulation in the semiconductor laser sensor 50, in this case there is no need of using an external light modulator as used in the case of a gas laser.

Recording of information on the recording material 10 according to the invention, that is, darkening of the light-absorbing film 14 in selected regions, needs to be achieved by the application of light with a relatively low energy density and preferably by light pulses of a relatively long duration and relatively low intensity.

The light-absorbing film 14 according to the invention has a light brown color in the state before optical writing of information thereon. When writing is performed with an adequate light power density, the light brown color in the irradiated regions changes into grayish brown or black, accompanied by an increase in optical density and also a change in reflectance.

Next, readout of information recorded on the recording material 10 will be described with reference to FIGS. 6 and 7.

Figure 6:
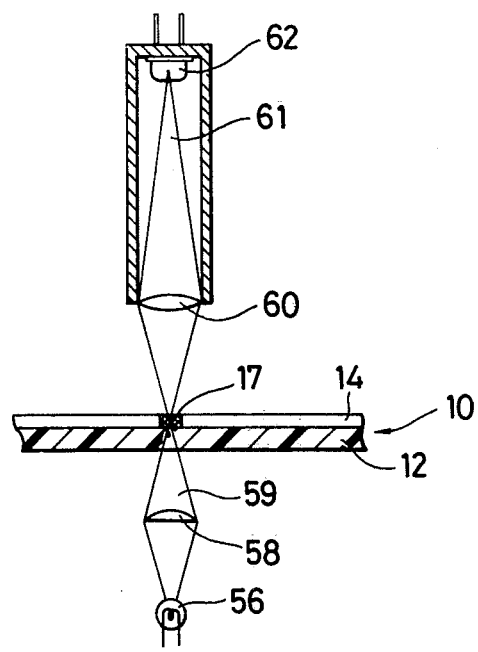
FIGS. 6 and 7 illustrate two types of methods for the readout of optical information recorded by a method according to the invention.

FIG. 6 illustrates a reproducing method of the transmitted light type. Located at a suitable distance from the back side of the base 12 of the recording material 10 is a light source 56 which may be, by way of example, a tungsten lamp, He-Ne laser, semiconductor laser or a light emitting diode. A condenser lens 58 is used to shape a spot light 59 by which a signal image 17 in the recording film 14 of the recording material 12 is irradiated from the base side. The light transmitted through the recording material 10 is converged by a lens 60 such that a spot light 61 serving as a reading light is focused onto a detector 62 such as a photoconductive diode. A faithful reproduction of the recorded information is possible since the intensity of the light 61 transmitted through the darkened region 17 of the recording film 14 lowers to about $\frac{1}{2}$ to 1/10 of a light intensity in the case of transmitting through a non-darkened region of the same film 14.

Figure 7:
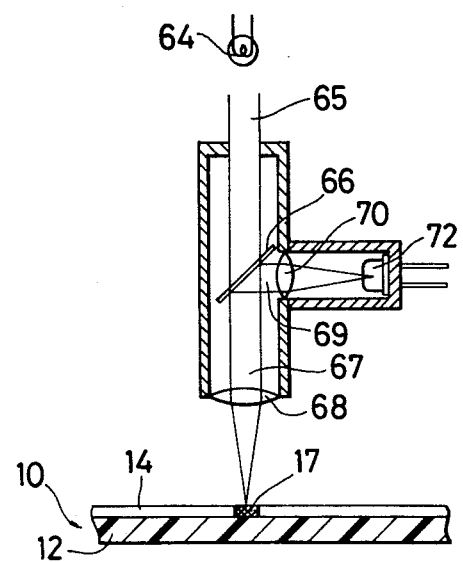

FIG. 7 illustrates a reproducing method of the reflected light type. In this case a light source 64 such as a tungsten lamp, He-Ne laser or semiconductor laser is located at a suitable distance from the thin film 12 of the recording material 14. Light rays 65 emitted by the light source 64 are made to pass through a half-mirror 66 and then focused by a lens 68 onto a signal image 17 in the thin film 14. The light reflected on the signal image 17 passes through the lens 68 and is reflected by the half-mirror 66 towards a detector 72 such as a photoconductive diode. Another lens 70 is used to focus the reflected light 69 onto the detector 72. In this case, the intensity of the reflected light 69 becomes 2 to 3 times as high as, or lowers to about $\frac{1}{2}$-$\frac{1}{3}$ of, the intensity of light reflected on the film 14 in the unused state.

As mentioned hereinbefore, it is an important merit of the present invention that information written on the novel recording material 10 can readily be erased. Erasing of the recorded information can be achieved by irradiating the selectively darkened film 14 of the recording material 10 by light rays in the visible or near infrared range of wavelength, and any of the above described optical systems for recording and reproducing purposes can be used also for the erasing purpose.

However, it is conditioned that the energy density $P_E$ (mJ/cm$^2$) of an erasing light on the surface of the film 14 of the recording material 10 is not lower, and usually is higher, than the energy density $P_W$ (mJ/cm$^2$) of light employed for writing the information on this film 14. Besides, the erasing is accomplished by the application of light pulses not longer in pulse duration $\tau$(ns) than light pulses employed for writing of the information.

For example, in the case of writing a bit signal on the recording film 14 by the application of a light pulse having a duration $\tau$ of about 300 ns it is necessary for sufficient darkening of the irradiated region of the film 14 that the energy density $P_W$ of the writing pulse is about 80 mJ/cm$^2$. To erase the resulting signal image by the application of a light pulse of the same duration $\tau$, it is necessary for revival of the initial color and optical density (such revival will be called "whitening" in contrast to "darkening") that the light energy density $P_E$ of the erasing pulse is as high as about 120 mJ/cm$^2$. In the case of accomplishing the writing by a light pulse of which duration $\tau$ is as short as about 50 ns, a writing energy density $P_W$ of about 40 mJ/cm$^2$ is appropriate, and erasing of the resultant signal image by a light pulse of the same duration requires an erasing light energy density $P_E$ of about 60 mJ/cm$^2$.

Where much importance is attached to the erasability of the recorded information, it is suitable to select TeO$_x$ ($0<x<2.0$), BiO$_x$ ($0<x<1.5$) or TlO$_x$ ($0<x<1.5$) each added with about 10 mole% of S as the material of the light-absorbing film 14, and a suitable thickness of this film 14 is about 0.15 μm.

The invention will be further illustrated by the following examples.

EXAMPLE 1

A powdery mixture of 90 mole% of $TeO_2$ and 10 mole% of sulfur was used as a a starting material, and a thin film 14 (about 0.2 μm thick) of $(TeO_x)_{90}S_{10}$, wherein $0<x<2.0$, was deposited on a transparent polyester base 12 by the vacuum evaporation method described hereinbefore with reference to FIG. 2, using a tungsten boat 22.

Figure 8:
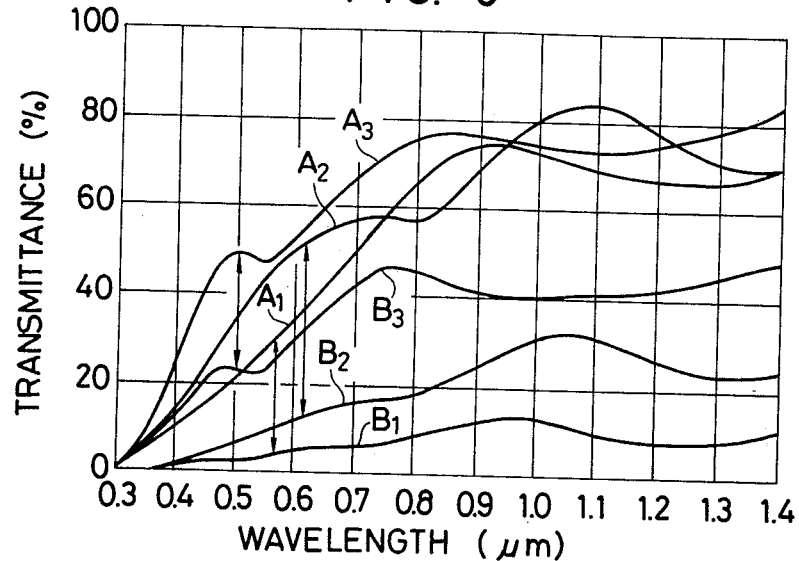
FIGS. 8 and 9 are spectral transmittance curves for several examples of optical information recording materials according to the invention.

This thin film 14 had a grayish brown color and exhibited a light-transmissive characteristic as represented by the spectral transmittance curve $A_1$ in FIG. 8. As shown, transmittance of this thin film was more than 20% in the visible range of wavelength. When light was applied to this film at an energy density of about 80 $mJ/cm^2$, the film exhibited a considerable increase in optical density with a resultant change in color from grayish brown to blackish brown. In this state, the film gave the spectral transmittance curve $B_1$ in FIG. 8. Making a comparison between the curves $A_1$ and $B_1$, it is understood that darkening of this thin film brought about more than 20% decrease in transmittance and a noticeable increase in the absorption of light in the visible range of wavelength. Owing to such a large difference in transmittance between the darkened regions and unchanged (not irradiated) regions, it was possible to optically record information on this thin film with a contrast ratio of 8:1 or greater.

When the darkened thin film was irradiated with light pulses shorter in duration and appropriately higher in energy density than the light pulses employed for darkening, the thin film resumed the initial color and low optical density state so that the spectral transmittance curve $A_1$ was obtained again. Accordingly, information recorded on this thin film could be erased completely and thereafter new information could be recorded on the same film.

By the same vacuum evaporation method, a thin film (0.4 μm) of $(GeO_x)_{70}S_{30}$ ($0<x<2.0$) and a thin film (0.4 μm) of $(SnO_x)_{70}S_{30}$ ($0<x<2.0$) were formed each on a transparent polyester base. Before application of light, these thin films of germanium suboxide and tin suboxide gave the spectral transmittance curves $A_2$ and $A_3$ in FIG. 8, respectively. As shown, these two kinds of thin films exhibited more than 40% transmittance in the visible range of wavelength. After irradiation with light to cause maximum darkening, the transmittance curves $A_2$ and $A_3$ shifted to the curves $B_2$ and $B_3$, respectively. This demonstrates the possibility of attaining more than 30% difference in transmittance between the darkened regions and unchanged regions of either of these two kinds of recording films. For either of these two films, it was possible to change the high optical density state represented by the curve $B_2$ or $B_3$ to the initial low optical density state of the curve $A_2$ or $A_3$ by irradiation with light pulses of appropriate energy density. However, these germanium suboxide and tin suboxide recording materials were somewhat lower in recording sensitivity than the tellurium suboxide recording material produced in this example.

EXAMPLE 2

This example illustrates the use of a suboxide of a trivalent metal or semimetal.

Using a powdery mixture of $Bi_2O_3$ and Se, a thin film (0.09 μm) of $(BiO_x)_{70}Se_{30}$, wherein $0<x<1.5$, was deposited on a transparent polyester base by the above described vacuum evaporation method.

Figure 9:
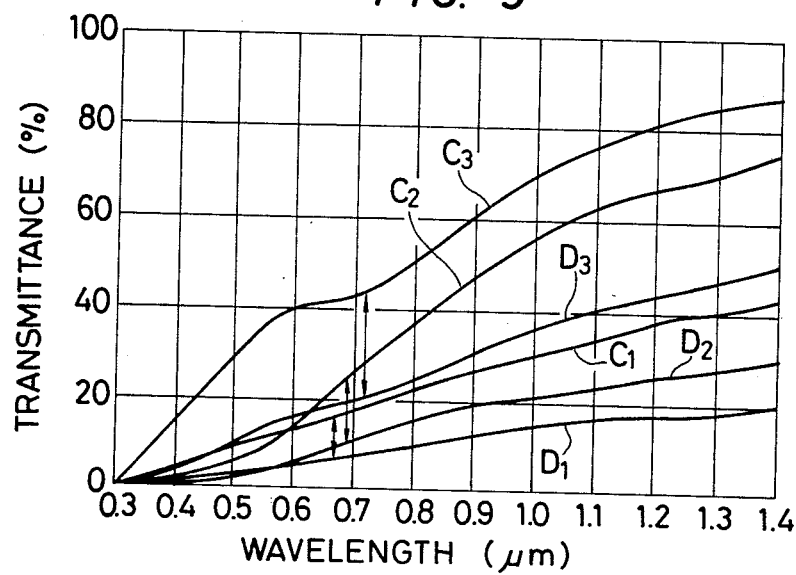

This bismuth suboxide film had a light brown color and gave the spectral transmittance curve $C_1$ of FIG. 9, showing about 20% transmittance in the visible range of wavelength. When light was applied at an adequate energy density, this film exhibited an increase in optical density as represented by the transmittance curve $D_1$ in FIG. 9 with the change of color from light brown to grayish brown. This bismuth suboxide (added with Se) recording material had a higher recording sensitivity than the recording materials produced in Example 1, so that is was possible to accomplish satisfactory recording of information at a light energy density of only about 50 $mJ/cm^2$ (with light pulses of 50 ns duration). Also in this case transmittance decreased with an increase in the absorption of light in the visible range of wavelength, but the difference in transmittance between the high optical density state (curve $D_1$) and the initial low optical density state (curve $C_1$) was relatively small and remained at the level of about 10%.

By the application of light pulses shorter in duration and higher in energy density than the light pulses employed for darkening, the darkened bismuth suboxide film resumed the initial low optical density state and again gave the transmittance curve $C_1$.

By the same vacuum evaporation method, a thin film (0.12 μm) of $(TlO_x)_{90}S_{10}$ ($0<x<1.5$) and a thin film (0.16 μm) of $(SbO_x)_{70}Se_{30}$ ($0<x<1.5$) were produced. Before application of light, these thin films of thallium suboxide and antimony suboxide gave the spectral transmittance curves $C_2$ and $C_3$ of FIG. 9, respectively. After irradiation with light to cause maximum darkening, the transmittance curves $C_2$ and $C_3$ shifted to the curves $D_2$ and $D_3$, respectively. As can be seen in FIG. 9, these thallium suboxide and antimony suboxide films exhibited somewhat greater magnitude of increase in optical density than the bismuth suboxide film produced in this example. Besides, these two kinds of recording materials were more higher in recording sensitivity than the bismuth suboxide recording material. For either of these thallium suboxide and antimony suboxide recording materials, it was possible to change the high optical density state represented by the curves $D_2$ or $D_3$ to the initial low optical density state of the curve $C_2$ or $C_3$ by irradiation with light pulses of appropriate energy density.

Furthermore, it was confirmed that recording sensitivity and the magnitude of the optical density change of a recording material according to the invention can be variously controlled by jointly using two or more kinds of suboxides described in Examples 1 and 2.

What is claimed is:

1. An optical information recording material comprising, as a photosensitive material which exhibits a change in optical density when optical energy is applied thereto, at least one suboxide of a metal or semimetal selected from the elements of Groups IIIB, IVB, VB and VIB added with at least one Group VIB element selected from the group consisting of S and Se.

2. An optical information recording material according to claim 1, wherein said photosensitive material is in the form of a thin film coated on a surface of a base.

3. An optical information recording material according to claim 2, wherein said at least one suboxide is selected from the group consisting of $TeO_x$, $GeO_x$, $SnO_x$ and $SiO_x$, wherein $0<x<2.0$.

4. An optical information recording material according to claim 2, wherein said at least one suboxide is selected from the group consisting of $BiO_x$, $SbO_x$, $TlO_x$ and $InO_x$, wherein $0<x<1.5$.

5. An optical information recording material according to claims 3 or 4, wherein the mole ratio of said at least one Group VIB element to said at least one suboxide is not greater than 50:50.

6. In a method of optically recording and reproducing information, wherein information is recorded on a thin film of a photosensitive material by applying optical energy to the thin film to cause a selective change in optical density of the thin film and subsequently reproduced by applying optical energy to the thin film to detect variations of optical density of the thin film resulting from the recording of information, the improvement comprising said photosensitive material being at least one suboxide of a metal or semimetal selected from the elements of Groups IIIB, IVB, VB and VIB and added with at least one Group VIB element selected from the group consisting of S aand Se.

7. A method according to claim 6, wherein information recorded on said thin film is reproduced by detecting variations of intensity of light transmitted through said thin film.

8. A method according to claim 6, wherein information recorded on said thin film is reproduced by detecting variations of intensity of light reflected on said thin film.

9. A method according to claim 6, wherein information is recorded on said thin film by applying light pulses of a first pulse duration to said thin film at a first light energy density to cause a selective increase in optical density of said thin film, the method further comprising the step of erasing information recorded on said thin film by applying light pulses of a second pulse duration, which is not longer than said first pulse duration, to said thin film at a second light energy density not lower than said first light energy density thereby decreasing the selectively increased optical density of said thin film.

10. A method according to claim 6 or 9, wherein said at least one suboxide is selected from the group consisting of $TeO_x$, $GeO_x$, $SnO_x$ and $SiO_x$, wherein $0<x<2.0$, the mole ratio of said at least one group VIB element to said at least one suboxide being not greater than 50:50.

11. A method according to claim 6 or 9, wherein said at least one suboxide is selected from the group consisting of $BiO_x$, $SbO_x$, $TlO_x$ and $InO_x$, wherein $0<x<1.5$, the mole ratio of said at least one Group VIB element to said at least one suboxide being not greater than 50:50.

12. A method according to claim 6, wherein information is recorded on said thin film by applying light in the visible range of wavelength to said thin film.

13. A method according to claim 6, wherein information is recorded on said thin film by applying light in the near infrared range of wavelength to said thin film.

* * * * *